United States Patent
Ahn et al.

(10) Patent No.: US 9,471,418 B2
(45) Date of Patent: Oct. 18, 2016

(54) MEMORY SYSTEM THAT DETECTS BIT ERRORS DUE TO READ DISTURBANCE AND METHODS THEREOF

(71) Applicant: Samsung Electronics Co., Ltd., Suwon-si OT (KR)

(72) Inventors: Se-Jin Ahn, Seoul (KR); Yong-Hyeon Kim, Yongin-si (KR); Sung-Up Choi, Hwaseong-si (KR); Yong-Kyeong Kim, Seoul (KR)

(73) Assignee: SAMSUNG ELECTRONICS CO., LTD., Samsung-ro, Yeongtong-gu, Suwon-si, Gyeonggi-do (KR)

(*) Notice: Subject to any disclaimer, the term of this patent is extended or adjusted under 35 U.S.C. 154(b) by 156 days.

(21) Appl. No.: 13/658,301

(22) Filed: Oct. 23, 2012

(65) Prior Publication Data

US 2014/0115419 A1    Apr. 24, 2014

Related U.S. Application Data

(62) Division of application No. 12/141,611, filed on Jun. 18, 2008, now Pat. No. 8,316,278.

(30) Foreign Application Priority Data

Jun. 19, 2007 (KR) .................. 10-2007-0060032

(51) Int. Cl.
G11C 29/00 (2006.01)
G06F 11/10 (2006.01)
H03M 13/09 (2006.01)
H03M 13/13 (2006.01)

(52) U.S. Cl.
CPC .......... *G06F 11/1048* (2013.01); *H03M 13/09* (2013.01); *H03M 13/13* (2013.01)

(58) Field of Classification Search
CPC ........... G06F 11/1068; G06F 11/1072; G06F 11/1008; G06F 11/1076; G11C 29/00
USPC ........................................................ 714/773
See application file for complete search history.

(56) References Cited

U.S. PATENT DOCUMENTS

| 4,768,193 | A | * | 8/1988 | Takemae .................. 714/711 |
| 5,134,616 | A | * | 7/1992 | Barth et al. ................. 714/711 |
| 5,638,385 | A | * | 6/1997 | Fifield et al. ............... 714/763 |
| 5,894,435 | A | | 4/1999 | Nobukata |
| 5,943,266 | A | | 8/1999 | Ogura et al. |

(Continued)

FOREIGN PATENT DOCUMENTS

| JP | 2003-007051 | 1/2003 |
| JP | 2003-217288 A | 7/2003 |

(Continued)

OTHER PUBLICATIONS

Examination Report from the Taiwanese Patent Office dated Jul. 24, 2014.

*Primary Examiner* — Albert Decady
*Assistant Examiner* — Enam Ahmed
(74) *Attorney, Agent, or Firm* — Muir Patent Law, PLLC

(57) ABSTRACT

Methods and memory systems are provided that can detect bit errors due to read disturbances. A main page of a flash memory in a memory system is read. A bit error in data that is read from the main page is detected and corrected. In parallel with reading the main page, a bit error is detected in data that is read from a dummy page of the flash memory.

19 Claims, 7 Drawing Sheets

(56) References Cited

U.S. PATENT DOCUMENTS

| | | | |
|---|---|---|---|
| 5,986,939 A | 11/1999 | Yamada | |
| 5,991,253 A * | 11/1999 | Yamamuro | 369/47.14 |
| 6,188,608 B1 | 2/2001 | Maruyama et al. | |
| 6,191,445 B1 | 2/2001 | Fujiwara | |
| 6,549,473 B2 | 4/2003 | Rolandi et al. | |
| 6,580,653 B2 | 6/2003 | Yamanaka | |
| 6,707,714 B2 | 3/2004 | Kawamura | |
| 6,741,505 B2 | 5/2004 | Yokozeki | |
| 6,801,464 B2 | 10/2004 | Kawano | |
| 7,072,137 B2 | 7/2006 | Chiba | |
| 7,099,190 B2 | 8/2006 | Noguchi et al. | |
| 7,136,986 B2 | 11/2006 | Han et al. | |
| 7,424,583 B2 | 9/2008 | Tsuboki et al. | |
| 7,453,728 B2 | 11/2008 | Noguchi et al. | |
| 7,623,385 B2 * | 11/2009 | Kim | G11C 16/0483 365/185.17 |
| 7,711,889 B2 | 5/2010 | Kudo et al. | |
| 7,751,238 B2 | 7/2010 | Seol | |
| 7,823,044 B2 | 10/2010 | Simon | |
| 8,189,379 B2 * | 5/2012 | Camp | G11C 16/3418 365/185.02 |
| 8,560,925 B2 * | 10/2013 | Hughes et al. | 714/773 |
| 2002/0184556 A1 * | 12/2002 | Hashemi | G06F 11/1076 714/5.11 |
| 2005/0210184 A1 | 9/2005 | Chen et al. | |
| 2006/0077724 A1 | 4/2006 | Chikusa et al. | |
| 2007/0011421 A1 | 1/2007 | Keller et al. | |
| 2007/0115960 A1 | 5/2007 | Yin | |
| 2008/0144450 A1 | 6/2008 | Chen | |
| 2009/0034328 A1 * | 2/2009 | Seol | 365/185.02 |
| 2009/0067241 A1 * | 3/2009 | Gorobets et al. | 365/185.04 |
| 2010/0281341 A1 * | 11/2010 | Wu et al. | 714/763 |
| 2013/0297987 A1 * | 11/2013 | Gupta | G06F 11/1064 714/773 |

FOREIGN PATENT DOCUMENTS

| | | |
|---|---|---|
| KR | 10-2004-0048870 | 6/2004 |
| KR | 10-2004-0093411 A | 11/2004 |
| KR | 10-2007-0035436 | 3/2007 |
| TW | 200733112 | 9/2007 |
| TW | I287226 A | 9/2007 |

\* cited by examiner

Fig. 8

| Page Num | 1st cycle | | 2nd cycle | | 3rd cycle | | ... |
|---|---|---|---|---|---|---|---|
| | K | RND(0) | K | RND(62) | K | RND(3) | |
| 0 | 1 | 1 | 2 | 3 | 4 | 5 | ... |
| 1 | 1 | 2 | 3 | 4 | 5 | 6 | ... |
| 2 | 1 | 2 | 3 | 4 | 5 | 6 | ... |
| 3 | 1 | 2 | 3 | 4 | 5 | 5 | ... |
| ⋮ | | | | | | | |
| k-1 | 1 | 2 | 3 | 4 | 5 | 6 | ... |
| k | 0 | 1 | 1 | 2 | 2 | 3 | ... |
| k+1 | 1 | 2 | 3 | 4 | 5 | 6 | ... |
| ⋮ | | | | | | | |
| 61 | 1 | 2 | 3 | 4 | 5 | 6 | ... |
| 62 | 1 | 2 | 3 | 3 | 4 | 5 | ... |
| 63 | 1 | 2 | 3 | 4 | 5 | 6 | ... |

1st Random Page ↑ (Page 0)
3rd Random Page ↑ (Page 3)
Read Page ↑ (Page k-1)
2nd Random Page ↑ (Page 62)

MEMORY SYSTEM THAT DETECTS BIT ERRORS DUE TO READ DISTURBANCE AND METHODS THEREOF

CROSS-REFERENCE TO RELATED APPLICATION

This application is a Divisional of and claims priority to U.S. non-provisional patent application Ser. No. 12/141,611 filed on Jun. 18, 2008, now allowed on Jul. 19, 2012, which claims priority under 35 U.S.C. §119 to Korean Patent Application No. 2007-0060032 filed on Jun. 19, 2007, the entirety of which is hereby incorporated by reference.

BACKGROUND

The present invention relates to a memory system, and more particularly, the present invention relates to a memory system that detects and corrects read errors.

Data that has become damaged due to various causes may be efficiently recovered by error detecting and correcting technologies. For example, data may be damaged while residing in memory and/or while being transferred from a source to a destination through a data transfer channel.

Various methods have been proposed to detect and correct damaged data. Well-known error detecting techniques include Read-Solomon (RS) code, Hamming code, Bose-Chaudhuri-Hocquenghem (BCH) code. Cyclic Redundancy Code (CRC) code, and the like. It may be possible to detect and correct damaged data using these codes.

In electronic devices using non-volatile memory devices, data may be stored in the non-volatile memory device (e.g., a flash memory device) together with a value called Error Correcting Code (ECC) (hereinafter, referred to as ECC data). As is well known in the Art, ECC data may be used to correct an error during a read operation from a flash memory device. However, the ability to correct such errors may be limited by the number of erroneous bits that are capable of being simultaneously corrected using the particular type of ECC data. A bit error that is detected during a read operation may be corrected via an error detecting and correcting code without necessitating the use of a separate data repairing process, such as a block replacement process.

FIG. 1 is a block diagram showing a conventional flash memory device, and FIG. 2 is a timing diagram illustrating a read operation of the flash memory device of FIG. 1.

A conventional flash memory device may include a memory cell array, which has a plurality of memory blocks. Only one memory block BLK0 is illustrated in FIG. 1. The memory block BLK0 may include strings (or, referred to as a NAND string) that are connected to bit lines, respectively. Each of the strings has a string select transistor SST, a ground select transistor GST, and memory cells (or memory cell transistors) MC0-MCn−1 connected in series between the select transistors SST and GST.

Gates of the select transistors SST and GST are connected to string and ground select lines SSL and GSL, respectively. Control gates of memory cell transistors MC0-MCn−1 are connected to corresponding word lines WL0-WLn−1, respectively. Bit lines BL0 and BL1 are connected with corresponding page buffers PB, respectively.

For a read operation, as illustrated in FIG. 2, a selected word line (e.g., WL0) is driven with a voltage of 0V, and respective un selected word lines (e.g., WL1~WLn−1) are driven with a read voltage Vread. At this time, string and ground select lines are supplied with the read voltage Vread, respectively. Page buffers PB apply sensing current to corresponding bit lines BL0 and BL1.

Voltages on the bit lines BL0 and BL1 may be determined according to cell states of memory cells that are connected with the selected word line. For example, if a memory connected with the selected word line is an ON cell, a voltage on a bit line may be lowered to a ground voltage. On the other hand, if a memory connected with the selected word line is an OFF cell, a voltage on a bit line may be increased to a power supply voltage. Afterwards, as cell data, voltages on bit lines may be sensed by corresponding page buffers.

For convenience of description, a memory cell connected with an unselected word line is referred to as an unselected memory cell, and a memory cell connected with a selected word line is referred to as a selected memory cell.

SUMMARY OF THE INVENTION

In some embodiments, a method of reading a flash memory in a memory system includes reading data from a main page of the flash memory. A bit error is detected and corrected in the data read from the main page. Data is read from a dummy page of the flash memory in parallel to the reading of the data from the main page. A bit error is detected in the data read from the dummy page of the flash memory.

In some further embodiments, the dummy page is randomly selected among a plurality of pages of the flash memory.

In some further embodiments, the dummy page is selected according to a defined sequence of pages of the flash memory.

In some further embodiments, an ECC algorithm is used to detect a number of bit errors in the data read from the dummy page, and in response to the number of detected bit errors exceeding a correction range of the ECC algorithm, addresses associated with a memory block including the dummy page are mapped to another memory block.

In some further embodiments, an ECC algorithm is used to detect a number of bit errors in the data read from the dummy page, and in response to the number of detected bit errors exceeding a correction range of the ECC algorithm, a detection result is stored in a storage device.

In some further embodiments, the detection result is stored in the flash memory within the storage device.

In some further embodiments, the detection result is stored in the storage device within a memory controller that controls the flash memory.

In some further embodiments, the storage device comprises a buffer memory of the memory controller.

In some further embodiments, a memory block of the flash memory including the dummy page is selectively replaced with another memory block depending upon a value of the detection result stored in the storage device.

In some further embodiments, in response to power-on of the memory system, the memory block of the flash memory including the dummy page is selectively replaced with the other memory block depending upon the value of the detection result stored in the storage device.

In some other embodiments, a method of reading a flash memory in a memory system includes determining when a main page of the flash memory has been repetitively read at least N times. Data is read from the main page and data is read from a dummy page of the flash memory in parallel in response to determining that the main page has been repetitively read at least N times.

In some further embodiments, the dummy page is not read in parallel to the main page when the main page is determined to have been repetitively read less than N times.

In some further embodiments, the dummy page is selected in a random manner among a plurality of pages in the flash memory.

In some further embodiments, the dummy page in the flash memory is selected according to a defined sequence of pages in the flash memory.

In some further embodiments, an ECC algorithm is used to detect a number of bit errors in the data read from the dummy page, and in response to the number of detected bit errors exceeding a correction range of the ECC algorithm, addresses associated with a memory block including the dummy page are mapped to another memory block.

In some further embodiments, an ECC algorithm is used to detect a number of bit errors in the data read from the dummy page, and in response to the number of detected bit errors exceeding a correction range of the ECC algorithm, a detection result is stored in a storage device.

In some further embodiments, the detection result is stored in the flash memory within the storage device.

In some further embodiments, the detection result is stored in the storage device within a memory controller that controls the flash memory.

In some further embodiments, the storage device comprises a buffer memory of the memory controller.

In some further embodiments, a memory block of the flash memory including the dummy page is selectively replaced with another memory block depending upon a value of the detection result stored in the storage device.

In some further embodiments, the selective replacing of the memory block is performed in further response to power-on of the memory system.

In some other embodiments, a memory system includes a flash memory having a plurality of pages and a memory controller configured to control the flash memory. The memory controller is configured to determine when a main page of the flash memory has been repetitively react at least N times, and to read data from the main page and read data from a dummy page of the flash memory in parallel in response to determining that the main page has been repetitively read at least N times.

In some further embodiments, the memory controller is configured to read the main page without parallel reading of the dummy page in response to determining that the main page has been repetitively read less than N times.

In some further embodiments, the dummy page is selected in a random manner among the plurality of pages of the flash memory.

In some further embodiments, tire dummy page is selected in a sequential manner among the plurality of pages of the flash memory.

In some further embodiments, the memory controller Is configured to use an ECC algorithm to detect a number of bit errors in the data read from the dummy page, and to respond to the number of detected bit errors exceeding a correction range of the ECC algorithm by mapping addresses associated with a memory block including the dummy page to another memory block.

In some further embodiments, the memory controller is configured to use an ECC algorithm to detect a number of bit errors in data read from the dummy page, and to respond to the number of detected bit errors exceeding a correction range of the ECC algorithm by storing a detection result in a storage device.

In some further embodiments, the storage device is within the flash memory.

In some further embodiments, the storage device is within the memory controller.

In some further embodiments, the memory controller is configured selectively replace a memory block of the flash memory including the dummy page with another memory block depending upon a value of the detection result stored in the storage device.

In some further embodiments, the memory controller is configured to respond to power-on of the memory system by selectively replacing the memory block of the flash memory including the dummy page with the other memory block, depending upon the value of the detection result stored in the storage device.

In some further embodiments, the flash memory and the memory controller comprise a memory card.

In some other embodiments, a read method of a memory system including a flash memory comprises reading a main page of the flash memory; and detecting and correcting a bit error generated at the main page, wherein in parallel with reading a main page, a dummy page except the main page is read, and a bit error generated at the dummy page is detected.

In some other embodiments, a read method of a memory system including a flash memory comprises determining whether a main page of the flash memory is read repetitively by N times; and if the main page is judged to be read repetitively by N times, reading the main page and a dummy page in parallel after an Nth read operation of the main page.

In some other embodiments, a memory system comprises a flash memory having a plurality of pages; and a memory controller for controlling the flash memory, wherein the memory controller is configured to judge whether a main page of the flash memory is read repetitively by N times, and if the main page is judged to be read repetitively by N times, to read the main page and a dummy page in parallel after an Nth read operation of the main page.

BRIEF DESCRIPTION OF THE FIGURES

Non-limiting and non-exhaustive embodiments of the present invention will be described with reference to the following figures. In the figures:

FIG. 8 is a table showing the number of read voltages applied to a word line when main and dummy pages are read at the same time in accordance with some embodiments of the present invention.

DETAILED DESCRIPTION OF EMBODIMENTS OF THE INVENTION

Figure 1:
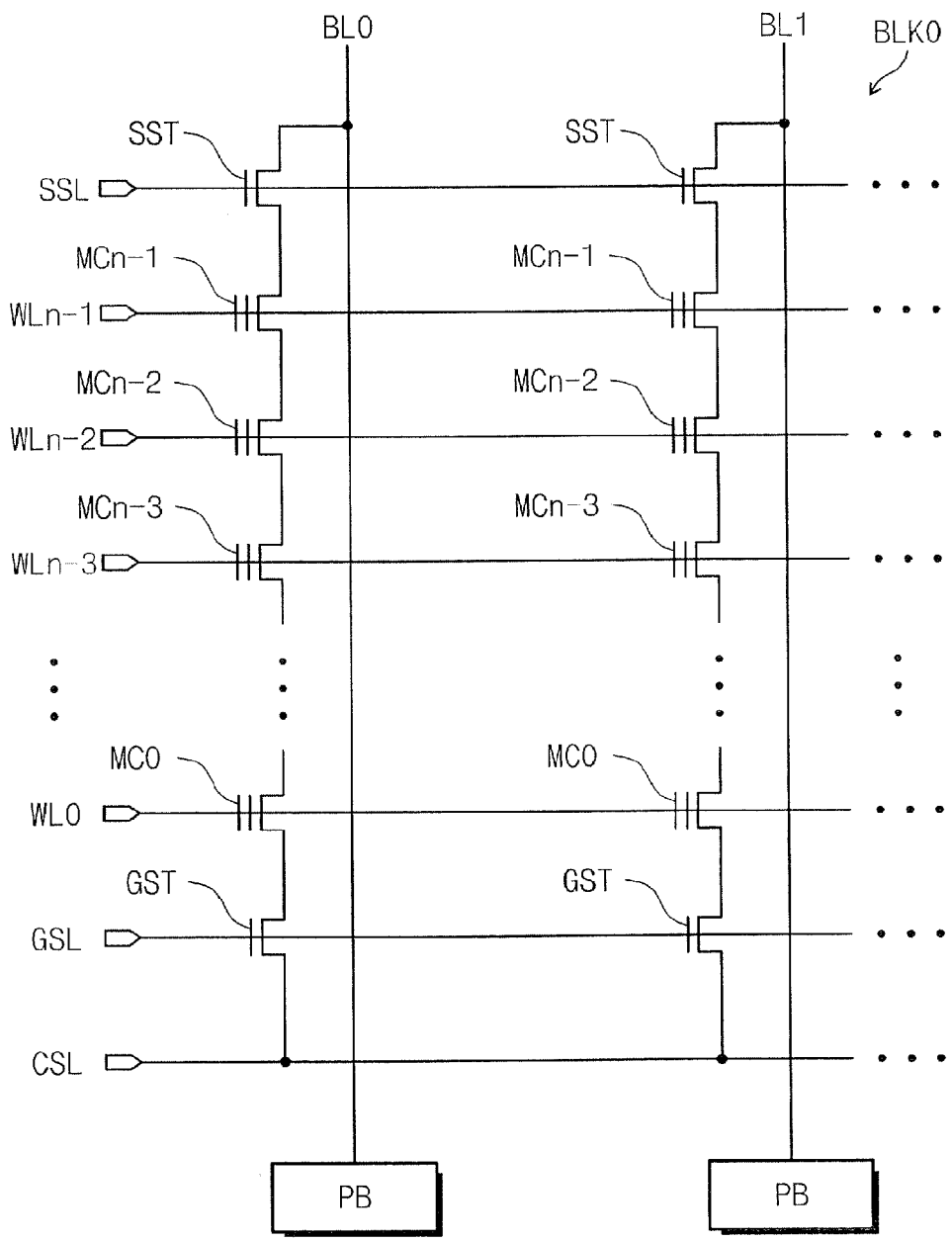
FIG. 1 is a block diagram showing a conventional flash memory device.
Figure 2:
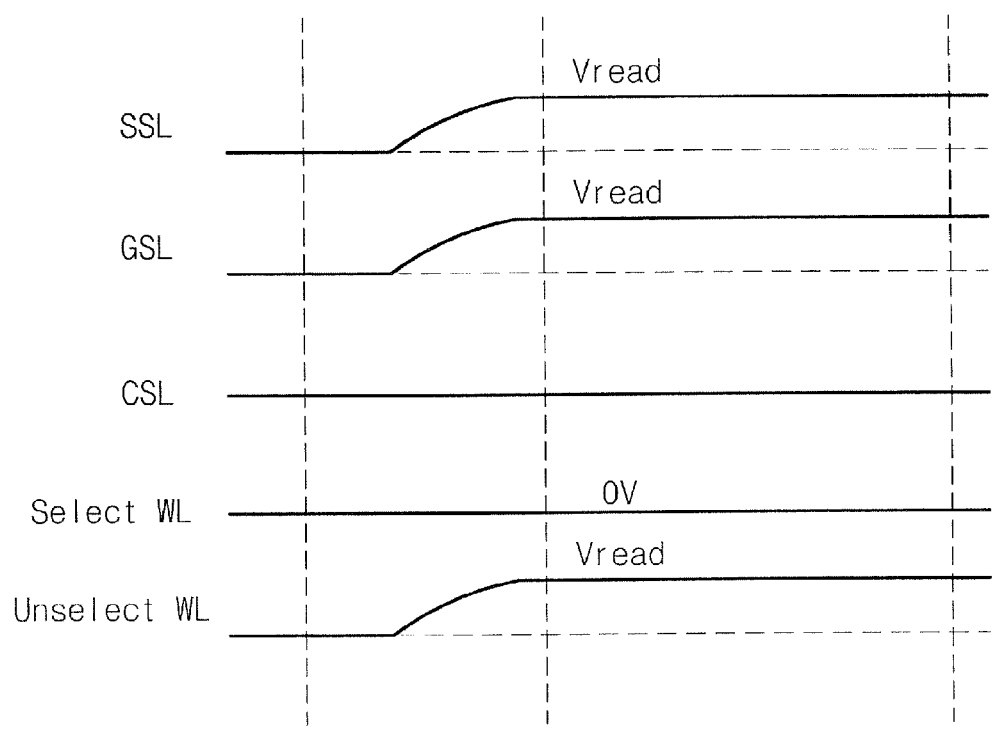
FIG. 2 is a timing diagram for a read operation of the flash memory device illustrated in FIG. 1.

Embodiments of the present invention now will be described more fully hereinafter with reference to the accompanying drawings, in winch embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a film, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present in contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to schematic illustrations of idealized embodiments (and intermediate structures) of the invention. The thickness of films, layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an etched/implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

As set forth above, to read cell data from a selected memory cell, a read voltage Vread may be applied to word lines of unselected memory cells. The read voltage Vread may be a voltage that is sufficiently high to turn on a memory cell transistor having an OFF state.

During a read operation, the read voltage Vread may be supplied to a control gate of an unselected memory cell transistor, and a ground voltage may be supplied to a substrate (or, a bulk) of the unselected memory cell transistor. At this time, a given voltage may be supplied to a drain of the unselected memory cell transistor. This bias condition may be analogous to that of a program operation, except bias voltage levels.

Figure 3:
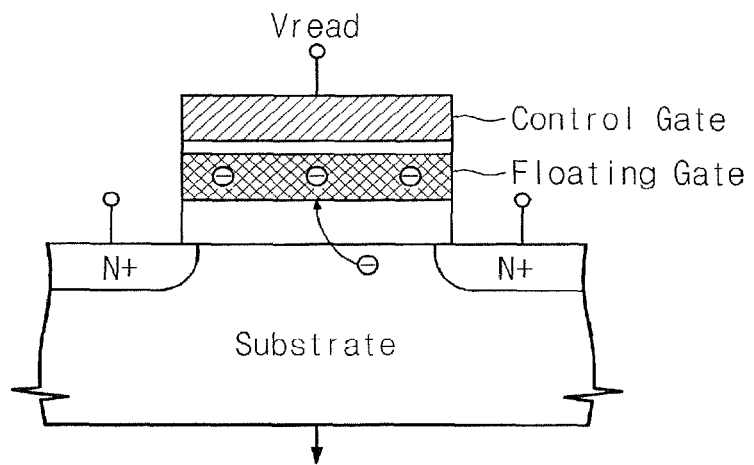
FIG. 3 is a cross-sectional view of a memory transistor showing occurrence of a read disturbance that may result in a soft program phenomenon.

With this bias condition, as illustrated in FIG. 3, electrons are capable of being injected into a floating gate of an unselected memory cell transistor from a substrate during a read operation. That is, an unselected memory cell transistor of an ON state (or, erase state) may be soft programmed under the bias condition of a read operation. This is called "read disturbance."

Figure 4:
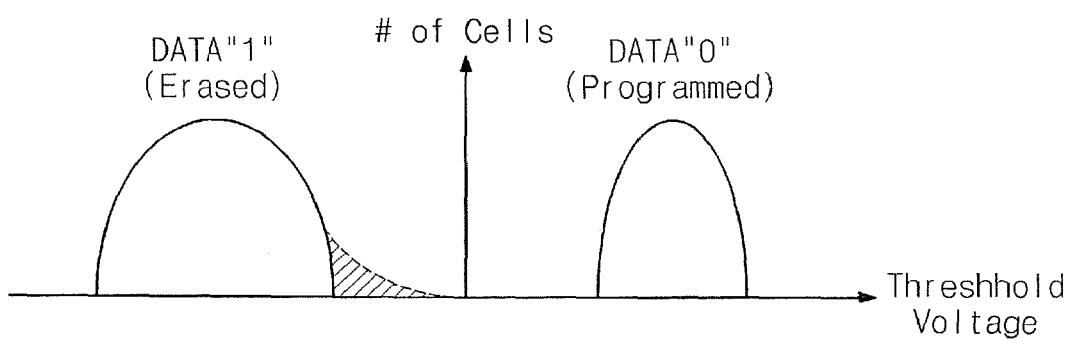
FIG. 4 is a graph showing threshold voltage distributions corresponding to on-cell and off-cell.

This read disturbance may make a threshold voltage of a memory cell of an ON-state for, erase state) be increased little by little. Its threshold voltage may be further increased according to repetition of a read operation as illustrated by a dotted line in FIG. 4. This may make a memory cell that has an ON state be erroneously identified as having an OFF state. That is, increase in a threshold voltage due to read disturbance may cause the read to fail due to an erroneous sensed state.

Figure 5:
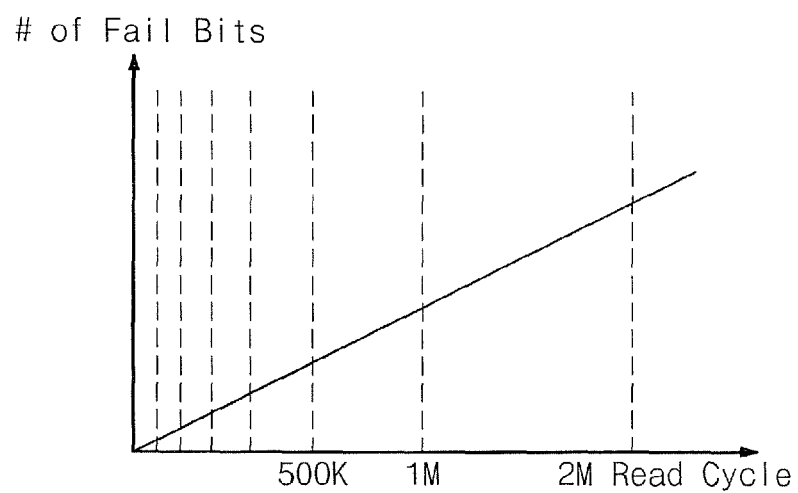
FIG. 5 is a graph showing correlation between number of read cycles and number of failed bits.

As described above, a bit error that is present during a read operation may be corrected via an error detecting and correcting technique without necessitating the use of a separate repair process, such as a well-known block replacement process. As read operations are repeated, there may be an increased likelihood of a read failure as illustrated in FIG. 5. Thus, although some data errors may be corrected, there may be higher probability of further errors occurring during subsequent read operations and which may exceed that error correction capabilities of the error detecting and correcting techniques.

When the number of bit errors exceeds a correctable threshold, a corresponding block in the memory containing the bit errors may be marked as a bad block. The bad block in a flash memory device may be replaced with a reserved memory block using a repair process such as a block replacement process which maps a replacement memory block to the address previously mapped to the bad block. It is noted that such blocks that are marked as bad due to read disturbance are not worn out due to repetition of program and erase operations. Accordingly, it is possible to reuse such bad blocks in a flash memory device by carrying out an erase operation on those blocks.

When some pages in a memory block are repetitively read, it may be difficult to detect a bit error with respect to remaining pages. Accordingly, it may be difficult to prevent page data from being damaged. For example, when a music file stored in specific memory pages is repetitively read via an MP3 player, a read voltage may be applied continuously to other unselected pages, so that the above-described read disturbance phenomenon is eventually caused to those unselected pages. Because the selected pages do not typically suffer from the read disturbance phenomenon, it may not be possible to detect and correct a bit error that is generated in those unselected pages.

Figure 6:
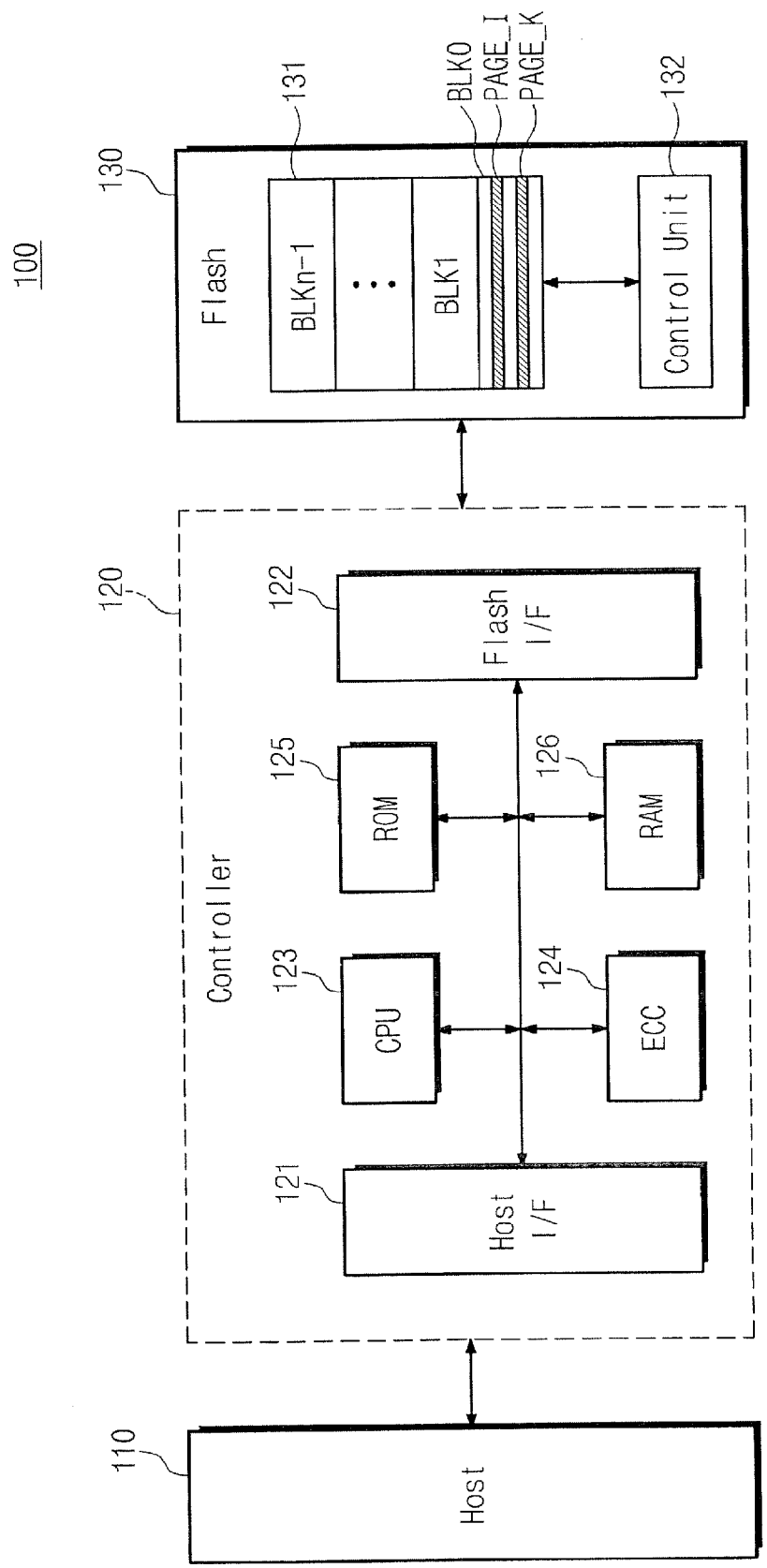
FIG. 6 is a block diagram showing a memory system according some embodiments of the present invention.

FIG. 6 is a block diagram showing a memory system according to the present invention. Referring to FIG. 6, a memory system 100 according to the present invention may include a host 110, a memory controller 120, and a flash memory 130.

In FIG. 6, the memory controller 120 and the flash memory 130 may be incorporated within storage such as USB memories, memory cards (e.g., MMC, SD card, xD card, SIM card, etc.), or the like. Further, such storage may be configured to be connected with a host 110 such as desktop and laptop computers, digital cameras, cellular phones, MP3 players, PMP, game machines, and the like.

With the memory system 100 of the present invention, when the host 110 repetitively reads only one or more pages (hereinafter, referred to as main pages) of the flash memory 130, it may be possible to detecting and correct for read disturbance problems that may occur in other non-selected pages (hereinafter, referred to as dummy pages). Example applications that may result in such read disturbances can include when music files stored in main memory pages are repetitively reread by an MP3 player, and when game programs stored in main memory pages are repetitively executed by a gaming device.

The memory controller 120 may be configured to repetitively read a main page PAGE_K of the flash memory 130 responsive to one or more requests from the host 110. The memory controller 120 may be configured to read a dummy page PAGE_I at a same time that (parallel with) it carries out a read operation with respect to the main page PAGE_K. Herein, the read operation of the main page PAGE_K is called a "main read operation," and the read operation of the dummy page PAGE_I is called a "dummy read operation." Although only one main page PAGE_K and one dummy page PAGE_I are illustrated in FIG. 6, the invention is not limited thereto as one or both of the main and dummy pages may include two or more pages.

With further reference to FIG. 6, the memory controller 120 may include a host interface 121, a flash interface 122, a Central Processing Unit (CPU) 123, an ECC circuit 124, ROM 125, and RAM (or, called a buffer RAM) 126. When the host 110 requests a read operation with respect to the main page PAGE_K, the memory controller 120 selects the main page PAGE_K and further selects the dummy page PAGE_I to perform the main read operation in parallel with (at the same time as) the dummy read operation. The memory controller 120 may select the dummy page PAGE_I in a random manner or according to a predefined sequence among pages in the flash memory 130.

The host interface 121 is configured to interface with the host 110, and the flash interface 122 is configured to interface with the flash memory 130. The CPU 123 is configured to control read and write operations of the flash memory 130 in response to requests from the host 110.

The ECC circuit 124 may generate ECC data using data (main data) transferred to the flash memory 130. The generated ECC data may be stored in a spare area of the flash memory 130. The ECC circuit 124 may detect one or more errors in data read out from the flash memory 130. If a detected error is correctable (or, a detected error is within a correction range of the ECC circuit 124), the ECC circuit 124 may correct the detected error. Although the ECC circuit 124 has been illustrated as a functional block within the controller 120, it may instead be incorporated within another functional block outside the memory controller 120, such as within the flash memory 130.

The ROM 125 may store data such as a boot code, and the RAM 126 may be used as a buffer memory. The RAM 126 may temporarily store data read from the flash memory 130 or data from the host 110 that is to be written to the flash memory 130. Further, the RAM 126 may store a Flash Translation Layer (FTL), which is operated by the CPU 123. The RAM 126 may include DRAM, SRAM, and/or other random access memory devices.

The RAM 126 may store table information that is used to manage read error information. The table information includes meta data, and is stored in a meta area of the flash memory 130 under the control of the CPU 123. The table information may be copied to the RAM 125 from the meta area of the flash memory 130 upon power-up of the memory system 100.

With continuing reference to FIG. 6, the flash memory device 130 may include a cell array 131 and a control unit 132. The control unit 132 may include a row decoder, a column decoder, a page buffer, a bit line selecting circuit, data buffer, and various other conventional circuits.

The cell array 131 may include a plurality of memory blocks BLK0~BLKn−1, each of which has a plurality of pages, for example, 32 or 64 pages. Each of the pages has a plurality of memory cells (e.g., 512 B or 2 KB memory cells) that are connected to share one word line. For a NAND flash memory, an erase operation is carried out on a memory block unit, and read and write operations are carried out on a page unit. The flash memory 130 may store single bit data or multi bit data per cell.

The memory system 100 according to some embodiments is configured to simultaneously read a main page PAGE_K and a dummy page PAGE_I in parallel. Because a main read operation is performed at a same time with a dummy read operation, the main page PAGE_K of the flash memory 130 may suffer from a read disturbance phenomenon like the dummy page PAGE_I. Further, according to some embodiments, it is possible to use the ECC algorithm to detect a bit error due to read disturbance at the dummy page PAGE_I.

Figure 7:
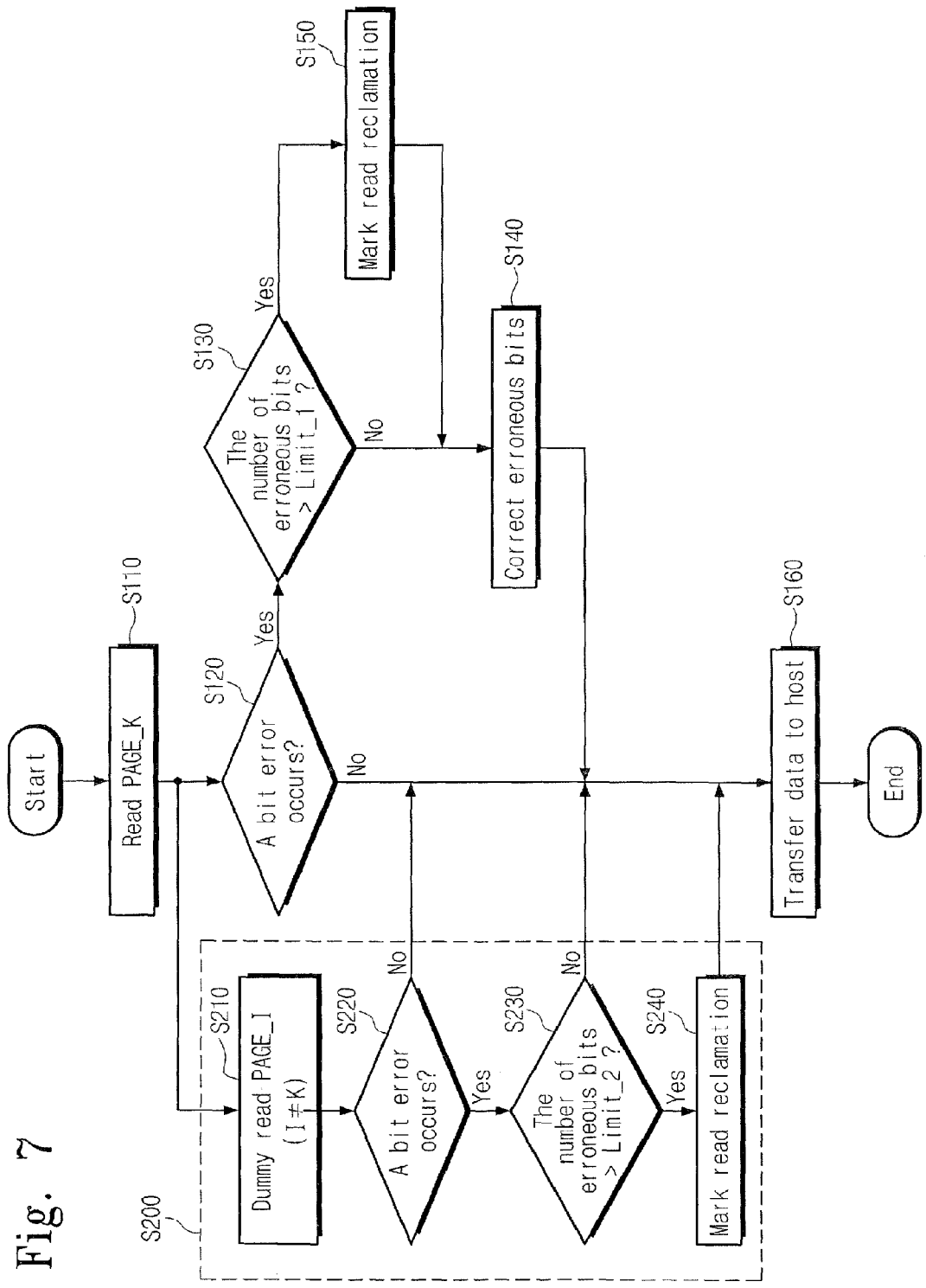
FIG. 7 is a flow chart that illustrates a read operation of the memory system illustrated in FIG. 6 in accordance with some embodiments of the present invention.

FIG. 7 is a flow chart that shows various methods of reading the memory system 100 illustrated in FIG. 6 in accordance with some embodiments of the present invention. These methods method are described with reference to FIGS. 6 and 7. In FIG. 7, a read operation for a dummy page PAGE_I may be performed in parallel with (at the same time as) a read operation for a main page PAGE_K. Initially, the host 110 may request a read operation with respect to the main page PAGE_K of the flash memory 130. The memory controller 120 may perform a read operation of the main page PAGE_K in response to the read request from the host 110.

Step S110 shows a main read operation with respect to the main page PAGE_K. The memory controller 120 reads the main page PAGE_K in response to the read request from the host 110. The memory controller 120 performs a read operation on the dummy page PAGE_I in parallel to the read operation on the main page PAGE_K. The read operation on the dummy page PAGE_I will be described in step S200.

In step S120, the memory controller 120 may determine whether a bit error occurs at the main page PAGE_K, using the ECC circuit 124. If not, in step S160, the memory controller 120 may send the data read from the main page PAGE_K to the host 110. However, if a bit error is detected, the procedure goes to step S130, where a determination is made as to whether the bit error exceeds a first correction range Limit_1. For example, assuming that the first correction range Limit_1 of the ECC circuit 124 is capable of simultaneously correcting four erroneous bits, in step S120 a determination is made as to whether the bit error includes five or more erroneous bits. When the bit error does not exceed the first correction range Limit_1, in step S140 the bit error may be corrected. However, when the bit error exceeds the first correction range Limit_1, the procedure goes to step S150 where a read reclamation operation is carried out.

Herein, the read reclamation operation is configured to recover data of a page that has become damaged due to a read disturbance phenomenon. During the read reclamation operation, data of a memory block including the damaged page may be copied back to another memory block. For example, assuming that the main page PAGE_K of the memory block BLK0 in FIG. 6 is damaged, data in the memory block BLK0 may be copied back to a memory block (e.g., BLK1). The read reclamation operation may include moving page data into RAM 126 and copying the data in the RAM 126 to a new data block. Further, the read reclamation operation may include a copy-back program operation that is generally used in a NAND flash memory.

As described, the read reclamation operation may be performed during step S150 and then proceed to step S140. Alternatively, a page needing read reclamation can be marked at step S150 and then proceed to step S140, and the read reclamation operation can be performed at a later time. For example, the read reclamation operation may be performed in response to power-on of the memory system 100 and/or in response to occurrence of an idle time of the flash memory 130.

The memory system 100 according to some embodiments of the present invention reads the dummy page PAGE_I in parallel with (at the same time as) the main page PAGE_K in step S200. The dummy page PAGE_I may be selected in a random manner or may be selected within the flash memory 130 according to a predefined sequence.

In step S210, a dummy read operation is carried out with respect to the dummy page PAGE_I, where dummy page PAGE_I is a different location within the flash memory 130 from the main page PAGE_K. In step S220, the BCC circuit 124 determines whether a bit error is present in the data read from the dummy page PAGE_I. If no error is present, then in step S160 the memory controller 120 sends the data read from the dummy page PAGE_I to the host 110. In contrast, when a bit error occurs, the procedure goes to step S230.

In step S230, a decision is made as to whether the number of bit errors exceeds a second correction range Limit_2. For example, assuming that the second correction range Limit_2 of the ECC circuit 124 is three erroneous bits (capable of simultaneously correcting 3 bits), then in step S230 a determination is made as to whether the number of bit errors includes four or more erroneous bits. When the bit error does not exceed the second correction range Limit_2, then in step S160 the data read from the dummy page PAGE_I and corrected by the ECC circuit 124 is sent to the host 110. In contrast, when the number of bit errors exceeds the second correction range Limit_2, the procedure goes to step S40 where a react reclamation operation is carried out in the manner described above. Afterwards, the procedure goes to step S160.

In accordance with some embodiments, in response to a determination that the main page PAGE_K has been repetitively read a defined number of times, a read operation is performed with respect to the dummy page PAGE_I. For example, in response to the main page PAGE_K being repetitively read a threshold N times (N being an integer), the main page PAGE_K and the dummy page PAGE_I are simultaneously read in parallel each subsequent time after the Nth read operation. The main and dummy read operations may be carried out in the same manner as described in FIG. 7.

Various embodiments of the present invention may thereby enable detection of a bit error due to repetitive read operations of a main page by performing a read operation of a dummy page in parallel with a read operation of the main page. Accordingly, the main page may be subjected to the same/similar read disturbance as different pages. And, because a dummy read operation is performed with respect to a dummy page that is different from the main page, various embodiments may therefore be capable of detecting a bit error that occurs in the dummy page.

FIG. 8 is a diagram showing the number of read voltages applied to a word line that triggers simultaneous reading of the main and dummy pages. When only a main page PAGE_K is repetitively read, no read voltage Vread is applied to the main page PAGE_K. after three read operations. In contrast, the read voltage Vread is applied to the remaining pages three times except the main page PAGE_K. This may cause the remaining pages to suffer from read disturbance and may result in a bit error occurring in the remaining pages.

To detect a bit error in the remaining pages that has resulted due to read disturbance, various embodiments of the present invention read from the main page PAGE_K in parallel with reading from the dummy pages PAGE_0, PAGE_62, and PAGE_3 as illustrated in FIG. 8.

In a first cycle, a read operation is performed with respect to the main page PAGE_K and a first random page PAGE_0. If a main read operation is performed, a read voltage Vread is applied to the remaining pages and not to the main page PAGE_K. Accordingly, referring to FIG. 8, '0' is marked at the main page PAGE_K, and '1' is marked at remaining pages.

When a dummy read operation is carried out with respect to a first random page PAGE_0, a read voltage Vread is applied to the remaining pages and not to the first random page PAGE_0. Accordingly, referring to FIG. 8, '1' is marked at the main page PAGE_K and the first random page PAGE_0, and '2' is marked at remaining pages.

In a second cycle, a read operation is performed with respect to the main page PAGE_K and a second random page PAGE_62. When a main read operation is carried out, a read voltage Vread is applied to remaining pages and not to the main page PAGE_K. Accordingly, referring to FIG. 8, '1' is marked at the main page PAGE_K, '2' is marked at the first random page PAGE_0, and '3' is marked at remaining pages.

When a dummy read operation is carried out with respect to the second random page PAGE_62, a read voltage Vread is applied to remaining pages and not to the second random page PAGE_62. Accordingly, referring to FIG. 8, '2' is marked at the main page PAGE_K, '3' is marked at the first and second random page PAGE_0 and PAGE_62, and '4' is marked at remaining pages.

In a third, cycle, a read operation will be carried out with respect to the main page PAGE_K and a third random page PAGE_3 in the same manner as described above. When a dummy read operation is performed with respect to the third random page PAGE_3, the main page PAGE_K is supplied with the read voltage Vread three times, the first, second, and third random pages PAGE_0, PAGE_62, and PAGE_3 are supplied with the read voltage Vread five times, and remaining pages are supplied with the read voltage Vread six times.

Thus, in accordance with some embodiments of the present invention, when a main page is repetitively read, dummy pages are also supplied with a read voltage Vread. Because the read voltage Vread is applied to the dummy pages, it may be possible to force a read disturbance to occur therein. Accordingly, it may be possible to detect and correct a bit error due to read disturbance. Further, since a read operation of a dummy page is performed in parallel with the main page, it may be possible to detect a bit error that has occurred in the dummy page.

The above-disclosed subject matter is to be considered illustrative, and not restrictive, and the appended claims are intended to cover all such modifications, enhancements, and other embodiments, which fall within the spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method of reading a flash memory in a memory system, the method comprising:
    reading data from a main page of the flash memory, the main page being selected by an external source;
    determining if a bit error exists in the data read from the main page;
    prior to determining to move data of a dummy page to another location of the flash memory, in response to the main page being selected by the external source, reading data from the dummy page of the flash memory, the dummy page not being selected by an external source;
    determining if a number of bit errors in the data read from the dummy page of the flash memory exceeds a threshold; and
    determining to perform a read reclamation in response to determining the number of bit errors in the data read from the dummy page exceeds the threshold, the read reclamation comprising correcting the bit errors of the data read from the dummy page and copying the bit error corrected data of the dummy page to the another location of the flash memory,
    wherein reading the data from the dummy page allows detection of errors in the data read from the dummy page that may result from a read disturbance caused by repetitive application of read voltages to unselected pages of the memory block.

2. The method of claim 1, wherein the dummy page is randomly selected among a plurality of pages of the flash memory.

3. The method of claim 1, wherein the dummy page is selected according to a defined sequence of pages of the flash memory.

4. The method of claim 1, further comprising:
    using an ECC algorithm to detect the number of bit errors in the data read from the dummy page; and
    in response to the number of detected bit errors exceeding the threshold, mapping addresses associated with a memory block including the dummy page to another memory block.

5. The method of claim 1, further comprising:
    using an ECC algorithm to detect the number of bit errors in the data read from the dummy page; and
    in response to the number of detected bit errors exceeding the threshold, storing a detection result in a storage device.

6. The method of claim 5, wherein the detection result is stored in the flash memory within the storage device.

7. The method of claim 5, wherein the detection result is stored in the storage device within a memory controller that controls the flash memory.

8. The method of claim 7, wherein the storage device comprises a buffer memory of the memory controller.

9. The method of claim 5, further comprising:
    selectively replacing a memory block of the flash memory including the dummy page with another memory block depending upon the detection stored in the storage device.

10. The method of claim 9, further comprising responding to a power-on of the memory system by selectively replacing the memory block of the flash memory including the dummy page with the other memory block depending upon of the detection result stored in the storage device.

11. A method of reading data from a nonvolatile memory device included in a storage device having a memory controller connected to the nonvolatile memory device, the method comprising:
    receiving a read command at the memory controller from a host;
    reading first data from selected memory cells connected to a selected word line in a memory block in the nonvolatile memory device in response to the read command to the memory controller, the selected word line being selected with the read command;
    prior to determining to move second data of other memory cells connected to another word line to another location of the nonvolatile memory, reading the second data from the other memory cells connected to the another word line in the memory block in the nonvolatile memory device in response to the read command to the memory controller, the another word line not being selected with the read command; and
    sending the first data to the host,
    wherein the memory controller is configured to detect and correct a first bit error included in the first data before sending the first data to the host, configured to determine if a number of bit errors in the second data read exceeds a threshold, and configured to perform a read reclamation in response to determining the number of bit errors in the second data read exceeds a-the threshold, the read reclamation comprising correcting the bit errors of the second data and copying the bit error corrected second data to another location of the nonvolatile memory, and
    wherein reading the second data allows detection of errors in the second data that may result from a read disturbance caused by repetitive application of read voltages to unselected word lines in the memory block.

12. The method of claim 11, further comprising:
    determining if the first bit error comprises a number of bit errors exceeding a first number, and mapping addresses associated with the memory block including the selected word line and the another word line to addresses associated with another memory block in the nonvolatile memory device in response to determining the first bit error comprises a number of bit errors exceeding the first number.

13. The method of claim 11, further comprising:
mapping addresses associated with the memory block including the selected word line and the another word line to addresses associated with another memory block in the nonvolatile memory device in response to determining the number of bit errors in the second data read exceeds the threshold.

14. The method of claim 11, wherein the storage device is a memory card.

15. The method of claim 11, wherein the storage device is a USB memory.

16. A memory system comprising:
a flash memory having a plurality of pages; and
a memory controller configured to control the flash memory,
wherein the memory controller is configured to receive a read command from a host, read first data from selected memory cells connected to a selected word line in a memory block in the nonvolatile memory device in response to the read command, read second data from other memory cells not selected by the host and connected to another word line in the memory block in the nonvolatile memory device in response to the read command at a time prior to a determination to move the second data to another location of the nonvolatile memory, and send the first data to the host, and
wherein the memory controller is configured to detect and correct a first bit error included in the first data before sending the first data to the host and configured to perform a read reclamation in response to determining a number of bit errors in the second data read exceeds a threshold, the read reclamation comprising correcting the bit errors of the second data and copying the bit error corrected second data to the another location of the nonvolatile memory,
wherein the memory controller configuration to read the second data allows detection of errors in the second data that may result from a read disturbance caused by repetitive application of read voltages to unselected word lines in the memory block.

17. The memory system of claim 16, wherein the memory controller is configured to map addresses associated with the memory block including the selected word line and the another word line to addresses associated with another memory block in the nonvolatile memory device upon determining that the first bit error comprises a number of bit errors exceeding a first number.

18. The method of claim 16, wherein the memory controller is configured to map addresses associated with the memory block including the selected word line and the another word line to addresses associated with another memory block in the nonvolatile memory device upon determining that the number of errors in the second data read exceeds the threshold.

19. A method for reclamation in a storage device including a nonvolatile memory device and a memory controller, the method comprising:
receiving a read command at the memory controller from an external source;
in response to the read command, reading and checking for a first bit error of data from selected memory cells connected to a selected word line in a memory block in the nonvolatile memory device;
at a time prior to performing a reclamation operation, in response to the read command, reading and checking for a second bit error of data from other unselected memory cells connected to another word line in the memory block that may have resulted from a read disturbance caused by repetitive application of read voltages to unselected word lines in the memory block; and
performing the reclamation operation for the memory block when the first bit error or the second bit error exceeds a certain limit,
wherein performing the reclamation operation comprises mapping addresses associated with the memory block including the selected word line and the another word line to addresses associated with another memory block in the nonvolatile memory, correcting at least one of the first bit error or the second bit error and copying the corresponding bit error corrected data to the another memory block in the nonvolatile memory,
wherein reading the second data allows detection of bit errors in the second data that may result from a read disturbance caused by repetitive application of read voltages to unselected word lines in the memory block.

* * * * *